United States Patent [19]
Wang et al.

[11] Patent Number: 6,135,791
[45] Date of Patent: Oct. 24, 2000

[54] METHOD FOR ACHIEVING UNIFORM EXPANSION OF DIELECTRIC PLATE

[75] Inventors: Jwo-Min Wang, Hsin-Tien; Shih-Wei Hsiao, Tu-Chen, both of Taiwan

[73] Assignee: Hon Hai Precision Ind. Co., Ltd., Taipei Hsien, Taiwan

[21] Appl. No.: 09/317,492

[22] Filed: May 24, 1999

[30] Foreign Application Priority Data

Nov. 20, 1998 [TW] Taiwan .................................. 87119235

[51] Int. Cl.⁷ .................................................. H01R 12/00
[52] U.S. Cl. ............................................. 439/83; 439/342
[58] Field of Search .............................. 439/83, 342, 70, 439/71

[56] References Cited

U.S. PATENT DOCUMENTS

| | | | |
|---|---|---|---|
| 4,988,310 | 1/1991 | Bright et al. ............................ | 439/342 |
| 5,562,474 | 10/1996 | Lee ........................................... | 439/342 |
| 5,569,045 | 10/1996 | Hsu ........................................... | 439/342 |
| 5,637,008 | 6/1997 | Kozel ........................................ | 439/342 |
| 5,704,800 | 1/1998 | Sato et al. ................................ | 439/342 |

*Primary Examiner*—T. C. Patel
*Attorney, Agent, or Firm*—Wei Te Chung

[57] ABSTRACT

A method for achieving uniform expansion of a dielectric plate made by injection molding includes the steps of forming core pins having a rhombic cross section at predetermined positions inside a mold for injection-molding the plate, injecting a plasticized dielectric material into the mold wherein the core pins guide the plasticized material flow for properly orienting molecules of the dielectric material, and curing and forming the dielectric plate in which rhombic holes corresponding to the core pins are formed. The properly oriented molecules of the dielectric material and the rhombic holes reduce the difference between thermal expansion coefficients in longitudinal and lateral directions of the plate thereby achieving uniform expansion thereof.

8 Claims, 4 Drawing Sheets

METHOD FOR ACHIEVING UNIFORM EXPANSION OF DIELECTRIC PLATE

BACKGROUND OF THE INVENTION

1. Field of the Invention

The present invention generally relates to a method for achieving uniform expansion of a dielectric plate and a dielectric plate made thereby.

2. The Prior Art

A central processing unit (CPU) of a computer is mounted to a main computer board by means of a connector. Conventionally, the CPU connector has contacts extending beyond top and bottom faces thereof for electrical engagement with pins of the CPU and conductive traces of the main board. The contacts are soldered to the main board by a through hole technique. Such a connector structure occupies a substantial amount of space on the main board and requires a sophisticated process to mount the connector thereon.

A ball grid array (BGA) connector effectively overcomes the problems discussed above. As shown in FIG. 3 of the attached drawings, a BGA connector 4 comprises a dielectric base plate 40 defining a number of bores (not labeled) therein between top and bottom faces thereof for receiving and retaining conductive contacts 41. Each contact 41 has a solder support section 42 extending beyond the bottom face of the base plate 40. A solder ball 3 is attached to the solder support section 42 by preheating the solder support section 42.

The contacts 41 are aligned with contact pads 50 formed on a circuit board 5 whereby when the base plate 40 is properly positioned on the circuit board 5, the solder balls 3 contact the corresponding contact pads 50. By means of heating, the solder balls 3 become molten and then solidify to be fixed to the contact pads 50 of the circuit board 5. An efficient and effective method for soldering the connector 4 to the circuit board 5 is thus achieved.

However, since the base plate 40 of the connector 4 and the circuit board 5 are generally made of different material having different thermal expansion coefficients, heating the solder balls 3 to fix the contacts 41 to the contact pads 50 will result in different amounts of expansion between the circuit board 5 and the base plate 40 leading to an undesired strain on the solder balls 3.

Furthermore, the base plate 40 is usually made by means of injection molding. During the molding process, plasticized dielectric material flows into a mold. Due to the complicated configuration of the base, a non-uniform distribution of the molecules of the dielectric material results leading to different amounts of thermal expansion in different directions of the base plate 40 when the base plate 40 is heated during a BGA soldering process. Such nonuniform thermal properties further complicate the above-mentioned problem.

Thus, it is desired to provide a method for achieving uniform expansion of a dielectric plate.

SUMMARY OF THE INVENTION

Accordingly, an object of the present invention is to provide a method for achieving uniform expansion of a dielectric plate.

Another object of the present invention is to provide a method for achieving substantially uniform thermal expansion between a connector and a circuit board to which the connector is mounted.

A further object of the present invention is to provide a base plate of a BGA connector which has substantially uniform thermal expansion properties.

A still further object of the present invention is to provide an injection-molded base plate of a BGA connector having limited warpage after being cured.

To achieve the above objects, a method is provided for achieving uniform expansion of a dielectric plate made by injection molding. The method comprises the steps of forming core pins having a rhombic cross section at predetermined positions inside a mold for injection-molding the plate, injecting plasticized dielectric material into the mold wherein the core pins guide the plasticized material flow for properly orienting molecules of the dielectric material, and curing and forming the dielectric plate in which rhombic holes corresponding to the core pins are formed. The properly oriented molecules of the dielectric material and the rhombic holes reduce the difference between thermal expansion coefficients in longitudinal and lateral directions of the plate thereby achieving uniform expansion thereof.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
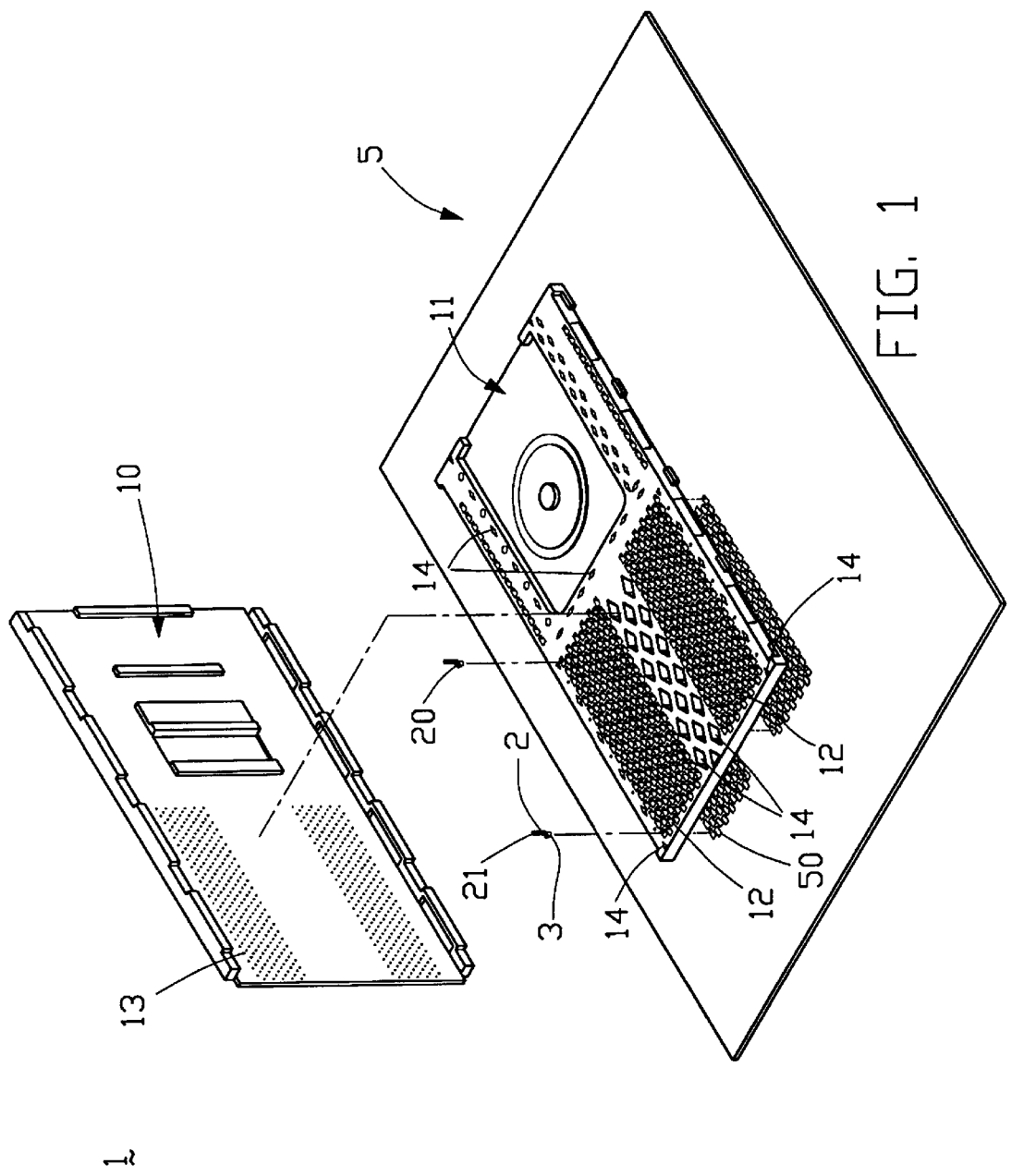
FIG. 1 is an exploded view of an electrical connector made by a method in accordance with the present invention, a base plate of the connector being mounted to a circuit board while a cover thereof is detached from the base plate.
Figure 1A:
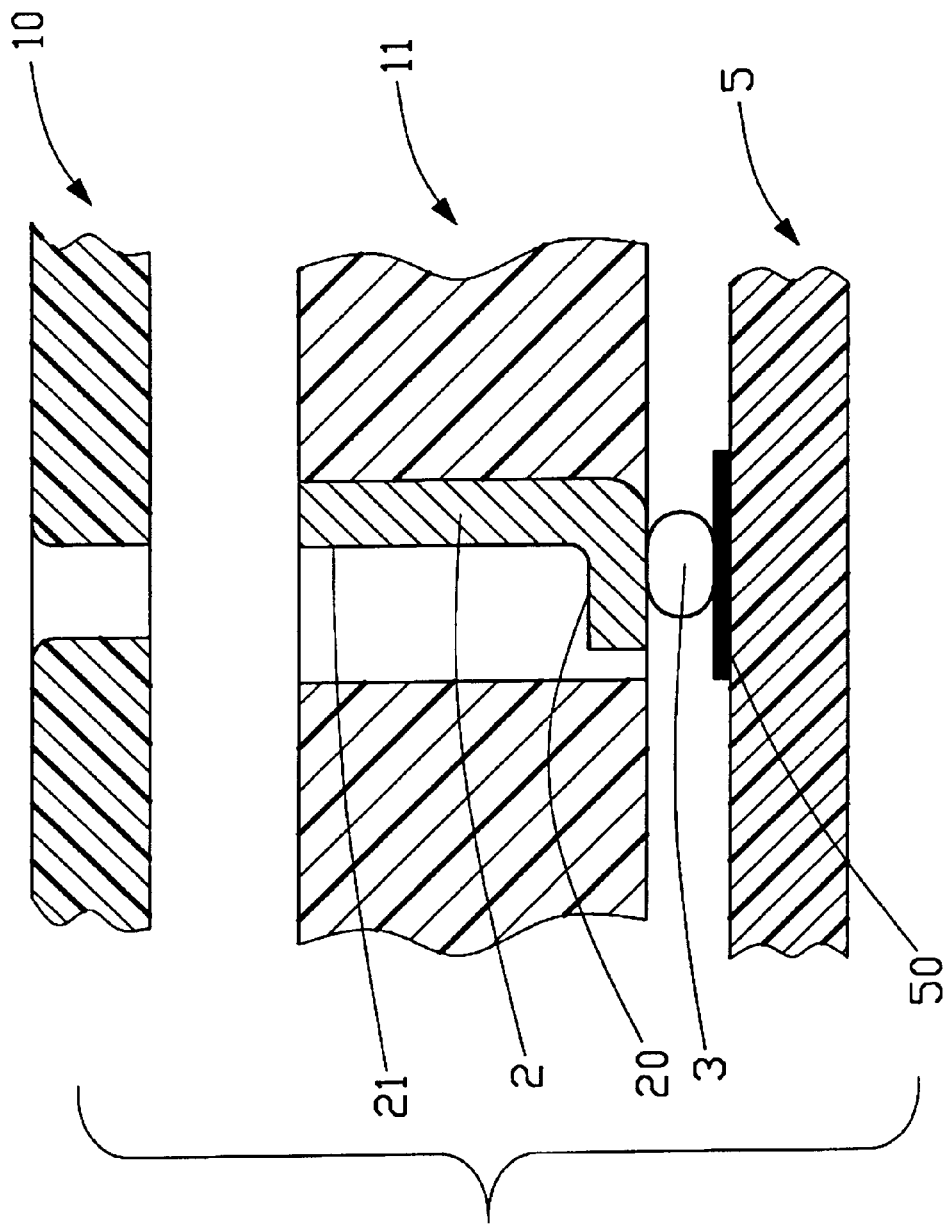
FIG. 1A is a fragmentary cross sectional view of the connector of FIG. 1 assembled to the circuit board, showing details of soldering a contact to a conductive pad of the circuit board.

Referring to the drawings and in particular to FIG. 1, an electrical connector 1 made by a method in accordance with the present invention comprises a base plate 11 mounted to a circuit board 5 and a cover 10 movably mounted on the base plate 11 for retaining an electronic device, such as a CPU (not shown), thereon. The base plate 11 and the cover 10 are made of dielectric material such as a liquid crystalline polymer (LCP) by injection molding.

A plurality of bores 12 arranged in rows is defined in the base plate 11 for receiving and retaining conductive contacts 2 therein. A plurality of through holes 13 is defined in the cover 10 corresponding to the bores 12 of the base plate 11 for receiving conductive pins of the electronic device therein. The pins extend through the holes 13 and partially extend into the corresponding bores 12 whereby when the cover 10 is moved with respect to the base plate 11, the pins are brought into engagement with the corresponding contacts 2 of the base 11.

Each contact 2 has a mating section 21 retained in the corresponding bore 12 for engagement with the corresponding pin of the electronic device and a solder ball support section 20 exposed to a bottom of the base plate 11 for supporting a solder ball 3 thereon with the solder ball 3 projecting beyond the bottom of the base plate 11.

The circuit board 5 has a number of conductive pads 50 formed thereon corresponding to the contacts 2. The base plate 11 is properly positioned on the circuit board 5 and the solder balls 3 contact the corresponding conductive pads 50 of the circuit board 5. By heating the solder balls 3, the solder balls 3 become molten and then solidify to fix the contacts 2 to the corresponding conductive pads 50 of the circuit board 5.

Since the dielectric material is in general not uniformly distributed throughout the whole base plate 11 and the cover 10 during the injection molding process and since the base plate 11 and the cover 10 are rectangular, when heated, the base plate 11 and the cover 10 are subject to different thermal expansion coefficients in different directions, such as a longitudinal direction and a lateral direction of the rectangle. Experimental data of a sample of the base plate 11 indicates that the thermal expansion coefficient in the lateral direction ($\alpha_x$) is $50 \times 10^{-6}$ mm/mm·° C. and the thermal expansion coefficient in the longitudinal direction ($\alpha_y$) is $5 \times 10^{-6}$ mm/mm·° C. The difference between $\alpha_x$ and $\alpha_y$ is substantial.

To overcome such a problem, in a preferred embodiment, a plurality of rhombic holes 14 is formed in the base plate 11. The distribution, location, and size of the rhombic holes 14 are carefully selected whereby the difference between the thermal expansion coefficients in both the longitudinal direction ($\alpha_y$) and the lateral direction ($\alpha_x$) is substantially reduced. Core pins having rhombic cross sections are provided in a mold for injection molding the base plate 11 resulting in the formation of the rhombic holes 14. The rhombic holes 14 are oriented such that a major diagonal direction thereof is substantially parallel to a flowing direction of the dielectric material that forms the base plate 11 whereby the plasticized dielectric material, when flowing in the mold as a plasticized fluid, is guided by the core pins to fill the mold leading to regular arrangement of the molecules of the dielectric material in the base plate after being cured. A small circle 15 representing a gate of the mold is provided in the base plate 11.

Figure 2:
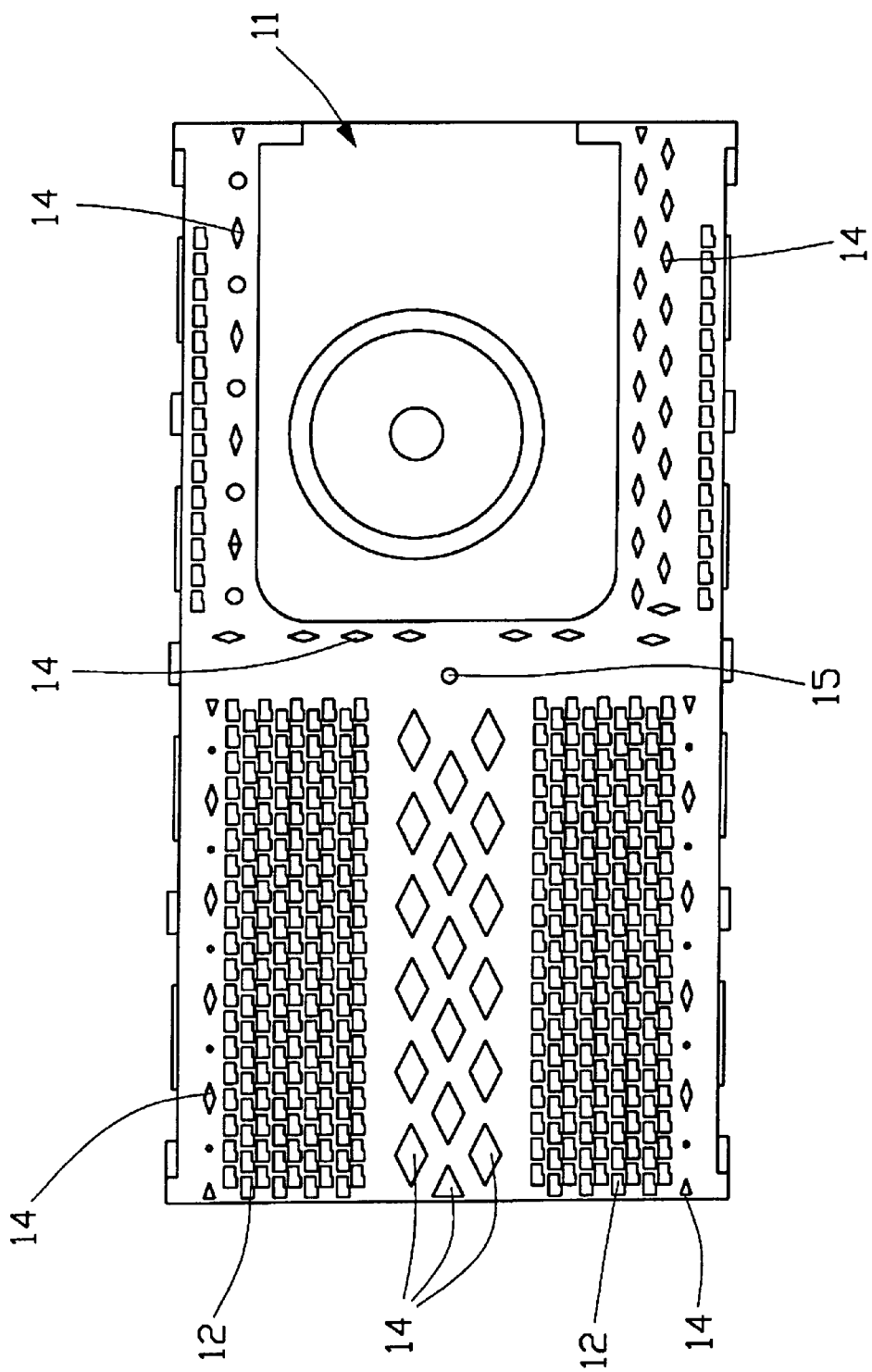
FIG. 2 is a top plan view of the base plate of the electrical connector made in accordance with the method of the present invention.
Figure 3:
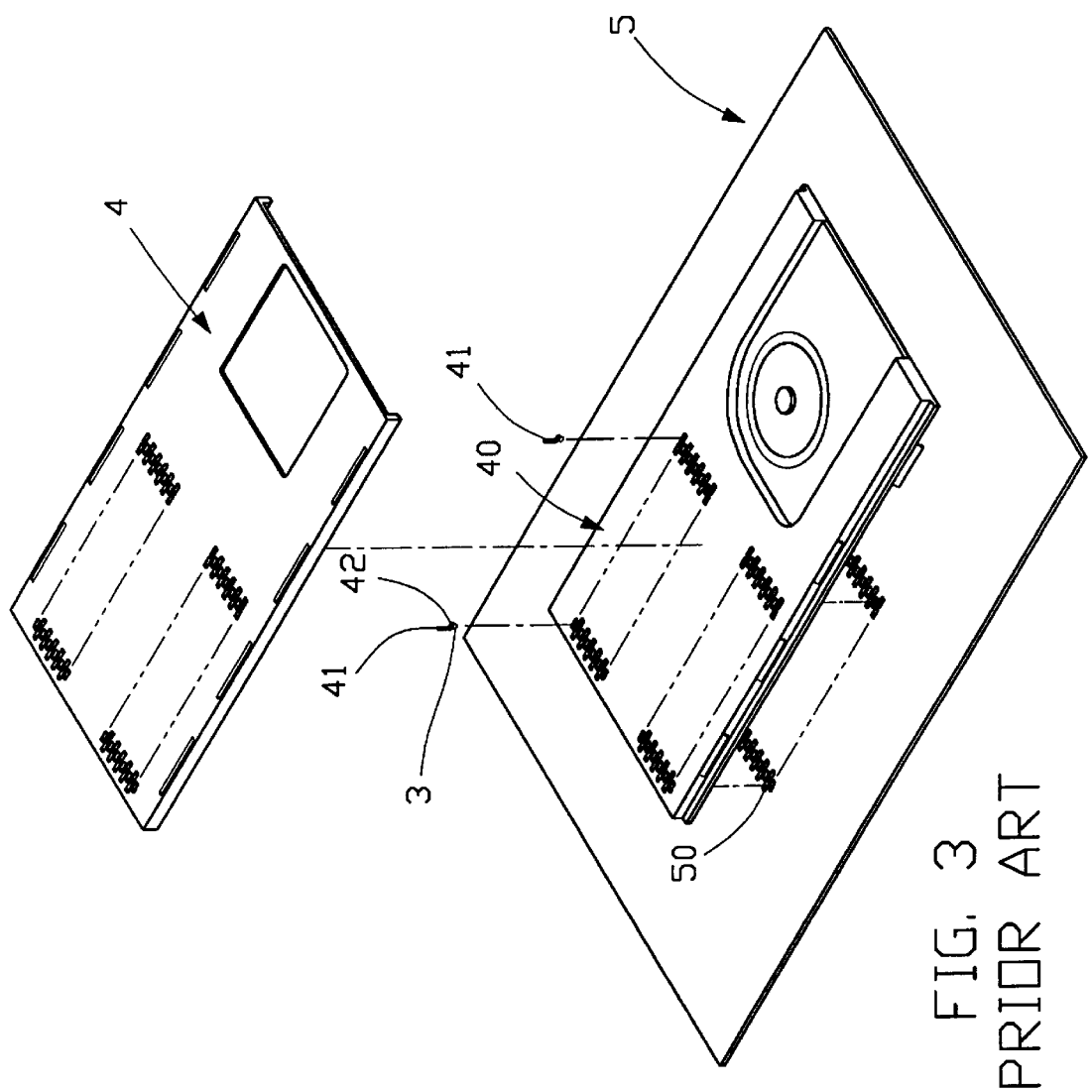
FIG. 3 is an exploded view of a conventional connector mounted to a circuit board.

The regular arrangement of the molecules of the dielectric material and the holes 14 formed after the mold is removed substantially reduce the thermal expansion coefficient in the lateral direction ($\alpha_x$), and slightly increase the thermal expansion coefficient in the longitudinal direction ($\alpha_y$). Experimental data shows that for the same sample discussed above with rhombic holes 14 formed therein having a pattern of hole distribution as shown in FIG. 2, the thermal expansion coefficient in the lateral direction ($\alpha_x$) is $22 \times 10^{-6}$ mm/mm·° C. and the thermal expansion coefficient in the longitudinal direction ($\alpha_y$) is $13 \times 10^{-6}$ mm/mm·° C. Hence, the difference therebetween is substantially reduced.

Furthermore, it is noted that the thermal expansion coefficient for a typical circuit board is $17-20 \times 10^{-6}$ mm/mm·° C. The base plate 11 made by the method of the present invention has thermal expansion coefficients in both longitudinal and lateral directions approximately equal to that of the circuit board. Therefore, a strain caused in the solder balls 3 due to different thermal expansions between the base plate 11 and the circuit board 5 is minimized.

The rhombic holes 14 formed by the additional core pins provided in the mold during the injection molding operation provide the following advantages. The plasticized dielectric material that forms the base plate 11 may be completely and uniformly distributed in the mold due to the presence of the core pins leading to uniform mechanical properties. Furthermore, warpage that often occurs in the injection-molded articles is reduced due to the uniform distribution of the dielectric material.

It should be noted that the holes 14 may be blind holes or through holes. The exact shape of the holes 14 may vary dependent upon the configuration of the base plate to be molded. If desired, some of the holes 14 can be alternately arranged in rows as show in FIG. 2.

To summarize, the present invention provides a method for achieving uniform expansion of a dielectric plate comprising the following steps:

(1) providing a mold for injection-molding the dielectric plate;

(2) determining locations, sizes and shapes of core pins formed inside the mold;

(3) injecting a plasticized dielectric material into the mold to form the dielectric plate wherein the core pins guide a flow of the plasticized dielectric material to uniformly fill the mold with molecules of the dielectric material properly oriented; and (4) curing and forming the dielectric plate in which holes corresponding to the core pins are formed.

Although the present invention has been described with reference to the best method thereof, it is apparent to those skilled in the art that a variety of modifications and changes may be made without departing from the scope of the present invention which is intended to be defined by the appended claims.

What is claimed is:

1. An electrical connector assembly comprising a connector and a circuit board, said connector including a base plate fixed to the circuit board and a cover movably mounted to the base plate, the base plate defining contact receiving bores for receiving and retaining conductive contacts therein, the contacts being soldered to corresponding conductive pads formed on the circuit board by means of solder balls, the cover being adapted to retain an electronic device thereon, pins of the electronic device extending through holes defined in the cover and partially extending into the contact receiving bores whereby when the cover is moved with respect to the base, the pins are brought into contact with and thus electrically engage with the contacts the holes in the base plate having shape different than the shape of the bores, the base plate additionally defining a plurality of holes not having contacts therein, said holes being arranged in a particular pattern on the base plate, the base plate further being made of a dielectric material, said dielectric material being completely and uniformly distributed in the base plate and having a regular arrangement of molecules, said regular arrangement of molecules being achieved by means of injection molding the base plate with a mold comprising core pins whereby the base plate molded thereby defines the plurality of holes in the particular pattern, said pattern having been determined empirically to reduce, both by arrangement of said plurality of holes in the finished base plate and by promotion of said regular arrangement of molecules during the injection molding process, a difference between thermal expansion coefficients of the base plate in first and second directions substantially normal to each other.

2. The electrical connector as claimed in claim 1, wherein the holes in the base plate are rhombic with a major diagonal direction thereof being substantially parallel to a flowing direction of a plasticized fluid of the dielectric material during injection molding.

3. The electrical connector as claimed in claim 1, wherein at least some of the holes formed in adjacent rows in the base plate are alternately arranged.

4. The electrical connector as claimed in claim 1, wherein the dielectric material is a liquid crystalline polymer.

5. The electrical connector as claimed in claim 1, wherein the base plate is substantially rectangular, and wherein the thermal expansion coefficient of the plate in the first direction is substantially close to $13 \times 10^{-6}$ mm/mm·° C. and the thermal expansion coefficient of the plate in the second direction is substantially close to $22 \times 10^{-6}$ mm/mm·° C.

6. The electrical connector as claimed in claim 1, wherein the circuit board is made of a material having a thermal expansion coefficient substantially corresponding to the thermal expansion coefficient of the base plate.

7. The electrical connector as claimed in claim 1, wherein the holes formed in the base plate have different sizes.

8. The electrical connector as claimed in claim 1, wherein the holes defined in the base plate are elliptical in shape with a direction of a major axis thereof being substantially parallel to a flowing direction of a plasticized fluid of the dielectric material during injection molding.

\* \* \* \* \*

(12) EX PARTE REEXAMINATION CERTIFICATE (9182nd)
United States Patent
Wang et al.

(10) Number: US 6,135,791 C1
(45) Certificate Issued: Aug. 14, 2012

(54) METHOD FOR ACHIEVING UNIFORM EXPANSION OF DIELECTRIC PLATE

(75) Inventors: Jwo-Min Wang, Hsin-Tien (TW); Shih-Wei Hsiao, Tu-Chen (TW)

(73) Assignee: Hon Hai Precision Ind. Co., Ltd., Tu-Chen, Taipei Hsien (TW)

Reexamination Request:
No. 90/011,995, Nov. 1, 2011

Reexamination Certificate for:
Patent No.: 6,135,791
Issued: Oct. 24, 2000
Appl. No.: 09/317,492
Filed: May 24, 1999

(30) Foreign Application Priority Data

Nov. 20, 1998 (TW) .................................. 87119235 A

(51) Int. Cl.
*H01R 12/00* (2006.01)

(52) U.S. Cl. .......................................... 439/83; 439/342
(58) Field of Classification Search ......................... None
See application file for complete search history.

(56) References Cited

To view the complete listing of prior art documents cited during the proceeding for Reexamination Control Number 90/011,995, please refer to the USPTO's public Patent Application Information Retrieval (PAIR) system under the Display References tab.

*Primary Examiner* — Yuzhen Ge

(57) ABSTRACT

A method for achieving uniform expansion of a dielectric plate made by injection molding includes the steps of forming core pins having a rhombic cross section at predetermined positions inside a mold for injection-molding the plate, injecting a plasticized dielectric material into the mold wherein the core pins guide the plasticized material flow for properly orienting molecules of the dielectric material, and curing and forming the dielectric plate in which rhombic holes corresponding to the core pins are formed. The properly oriented molecules of the dielectric material and the rhombic holes reduce the difference between thermal expansion coefficients in longitudinal and lateral directions of the plate thereby achieving uniform expansion thereof.

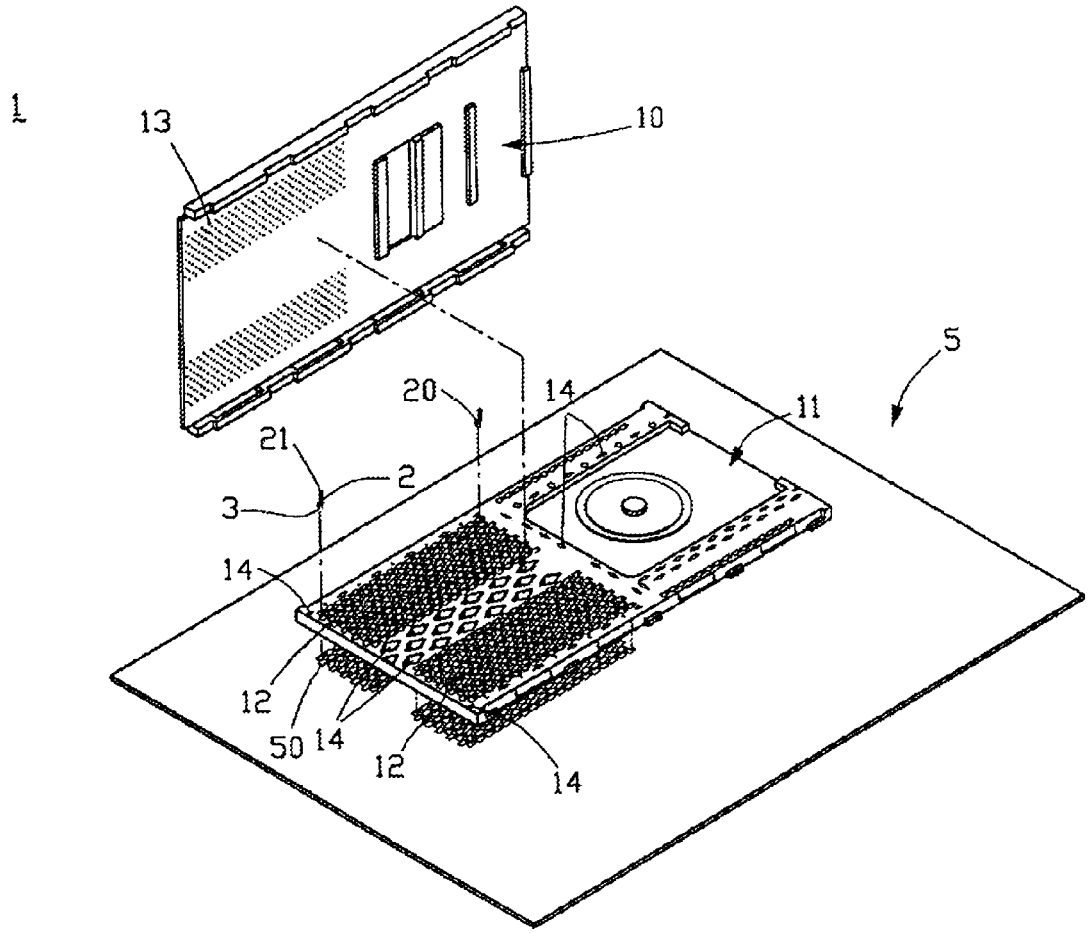

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-8 is confirmed.

\* \* \* \* \*